(12) United States Patent
Amir et al.

(10) Patent No.: US 6,188,259 B1
(45) Date of Patent: Feb. 13, 2001

(54) SELF-RESET FLIP-FLOP WITH SELF SHUT-OFF MECHANISM

(75) Inventors: Chaim Amir; Heip P. Ngo, both of Sunnyvale, CA (US)

(73) Assignee: Sun Microsystems, Inc., Palo Alto, CA (US)

(*) Notice: Under 35 U.S.C. 154(b), the term of this patent shall be extended for 0 days.

(21) Appl. No.: 09/433,518

(22) Filed: Nov. 3, 1999

(51) Int. Cl.[7] .................................................. H03K 3/02
(52) U.S. Cl. ................................................ 327/198; 327/217
(58) Field of Search ........................... 327/198, 199–201, 327/208–212, 215, 217, 218, 219, 225

(56) References Cited

U.S. PATENT DOCUMENTS 5,461,649 * 10/1995 Bailey et al. ........................ 327/225
5,898,640 * 9/1999 Ben-Meir et al. ................... 327/218

* cited by examiner

Primary Examiner—Toan Tran
(74) Attorney, Agent, or Firm—Sierra Patent Group, Ltd.

(57) ABSTRACT

An electronic system is described for a flip-flop circuit having a data input stage with a clock input and a data input, coupled to an output stage which generates at least one data output, a reset circuit coupled to said data output stage for resetting the logic state of the data outputs to a predetermined desired condition, and a shutoff circuit coupled to said data input stage blocking data input from being acted on by said data input stage. An alternate embodiment includes a data processing circuit with a feedback mechanism coupled with the reset circuit of the flip-flop which informs the flip-flop that data is no longer required.

7 Claims, 4 Drawing Sheets

SELF-RESET FLIP-FLOP WITH SELF SHUT-OFF MECHANISM

BACKGROUND OF THE INVENTION

1. Field of the Invention

The present invention is related to digital sequential logic circuits. More particularly, the present invention presents a self-resetting flip-flop for use in high-speed electronics.

2. The Background Art

In high speed digital electronics, it is often desirable to have the output of one functional unit isolated from the input of the other, except at certain times.

FIG. 1 is a prior art example of isolating one functional unit from another using flip-flips.

Referring to FIG. 1, system 10 includes a device 12 which is coupled to an address bus 14. Memory manager 16 is coupled to address bus 14 and memory 18, and includes row circuitry 20 and column circuitry 22. Row circuitry 20 and column circuitry 22 each have similar circuitry which is used to access the memory cells corresponding to an address on the address bus. Thus, flip-flops 24, predecoder 26 and decoder 28 are each present in row circuitry 20 and column circuitry 22.

In order to provide the highest level of data throughput to and from memory, it is desirable to isolate activity on an address bus from address decoders, except at specific times when the address data is generally held to be valid.

In order to isolate the address bus from the decoder a flip-flop is often provided between the bus and the decoder. As is known by those of ordinary skill in the art, a flip-flop takes a data state present on its input and latches that data to its output, on the rising edge of a clock cycle.

In some cases, it is appropriate to reset the flip-flop output to a known "safe" state so that functional units using the data supplied by the flip-flop will always be receiving valid data.

Although prior art flip-flops are suitable for their intended purpose of providing a measure of isolation between the incoming data lines and the output lines, the reset mechanisms present in these flip-flops are often not fast enough to meet the demands of high speed electronics. It would therefore be beneficial to provide a flip-flop having a fast reset mechanism.

SUMMARY OF THE INVENTION

The present invention is a dynamic flip-flop circuit with a set-reset shut-off mechanism which comprises a data input stage, an output stage, a reset circuit and a shut-off circuit. The data input stage has a clock input, a data input and an input stage output. The output stage has an input coupled to the input stage output, and generates at least one data output. The reset circuit has a reset input coupled to the data output and has a reset output coupled to the output stage, which resets the logic state of the output stage to a predetermined desired condition. The shutoff circuit receives the clock input and the input stage output and generates a shut-off circuit output signal which is presented to the data input stage to disable the data input stage after a predetermined time period.

In operation, input data signals and clocking signals are communicated to a data input stage. When the clocking signal is high, the circuit is in the evaluation phase and the data input stage provides data and the complement of data to be submitted to an output stage which generates Q and Q! output pulses.

The Q and Q! output are also communicated to a reset circuit. The reset circuit operates to ensure that a desired quiescent state is achieved and "resets" the output stage.

The shut-off circuit performs the function of disabling the data signal using the leading edge of the clocking signal. The dynamic flip-flop circuit permits input data to be sampled for a short time interval defined by the clock signal going high and a shut-off circuit output going low.

This particular self reset flip-flop with a self shut-off circuit reduces hold time for the data inputs and provides reduced clock loading. Additionally, the flip-flop circuit provides more robustness and better noise immunity than previous self reset flop designs. Finally, the self reset flip-flop with shut-off circuit is a simple design which occupies a small area.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
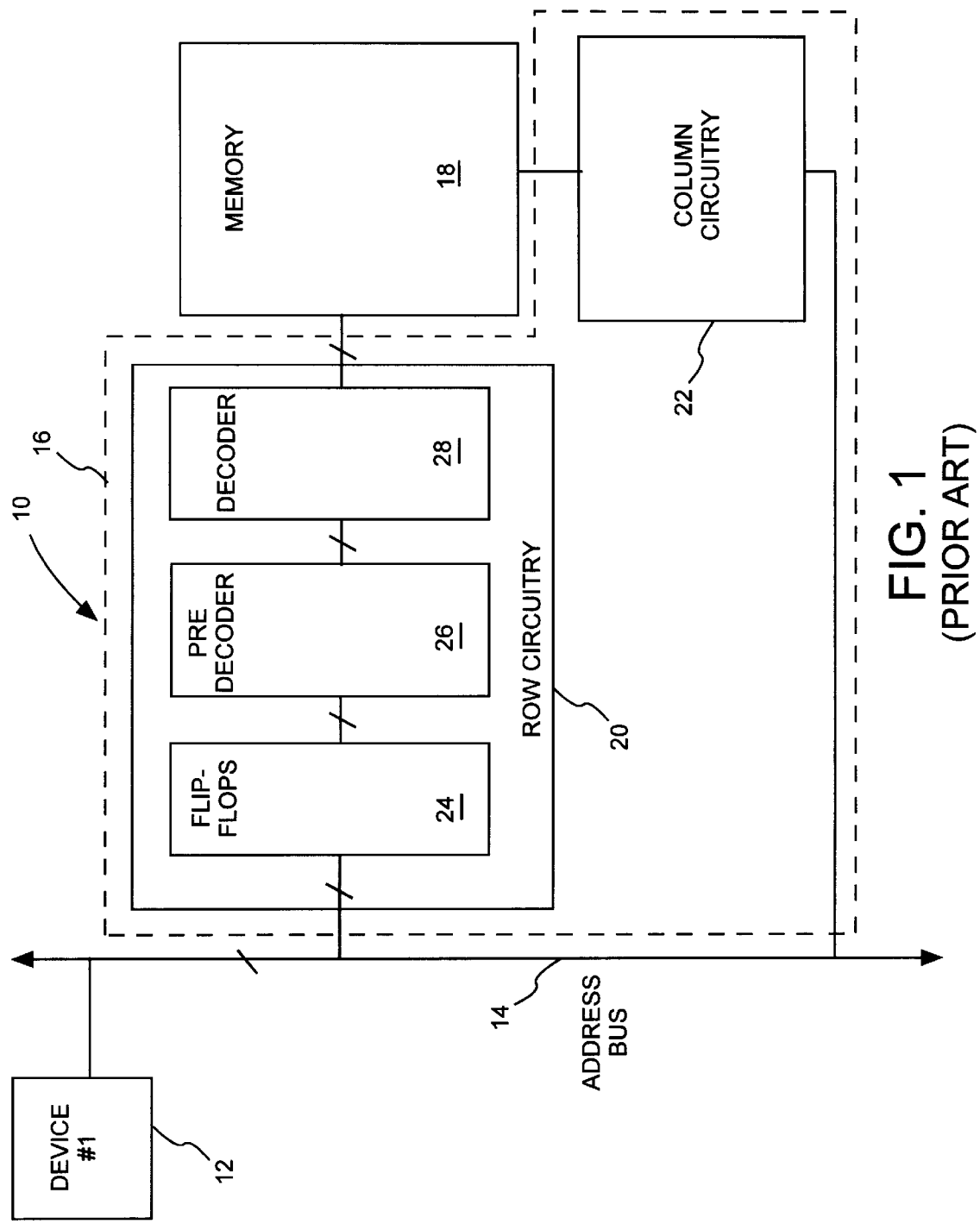
FIG. 1 is a prior art example of isolating one functional unit from another using flip-flips.
Figure 2:
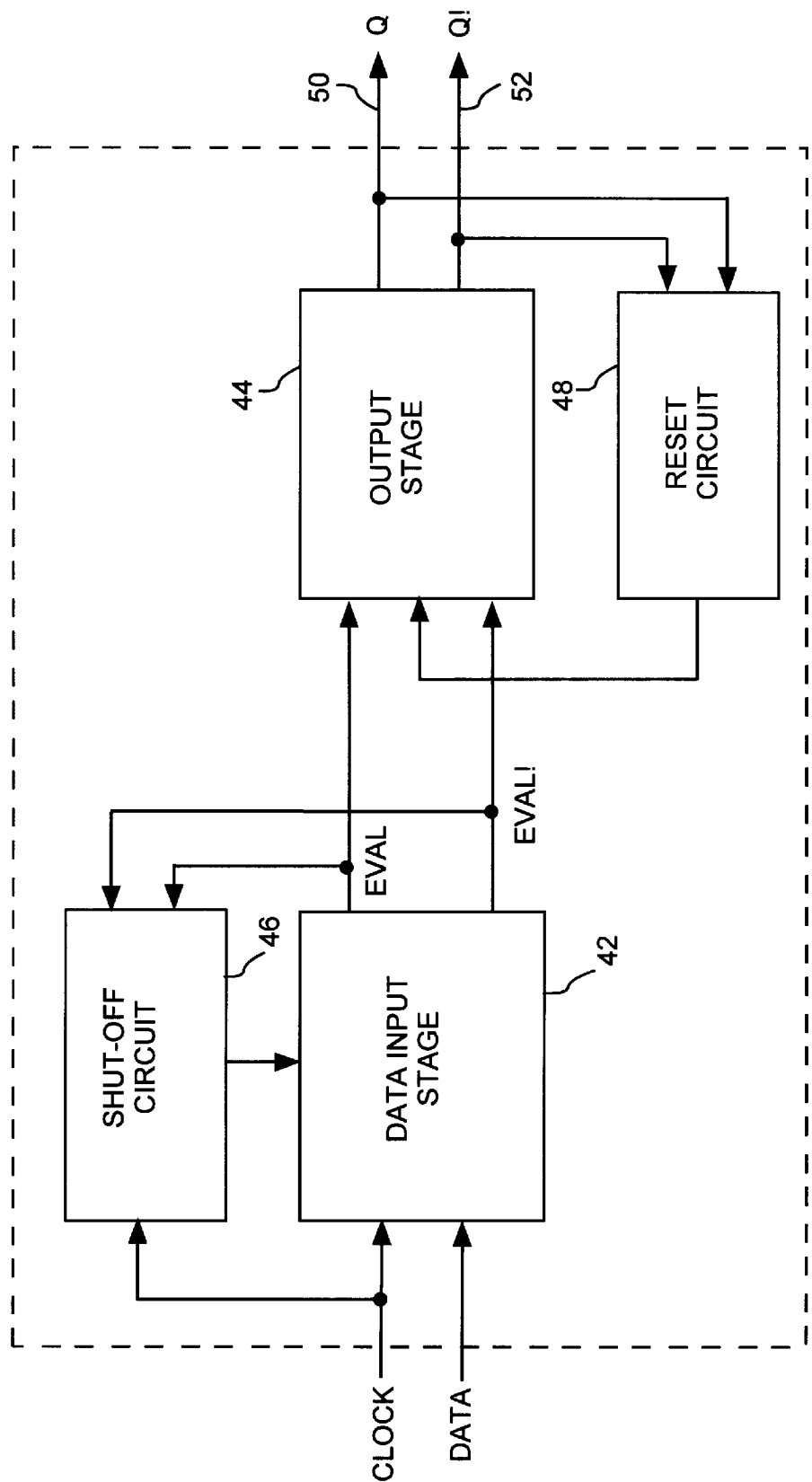
FIG. 2 is a block diagram of a present invention flip-flop system having a self-resetting output.

FIG. 2 is a block diagram of a present invention flip-flop system having a self-resetting output.

Referring to FIG. 2, system 40 includes data input stage 42, output stage 44, shut-off circuitry 46 and reset circuitry 48. Data input stage 42 is intended to provide any required data manipulation prior to that data being provided to output lines 50 and 52. In one embodiment of the present invention, data input stage 42 includes an inverter which receives a single bit of information and provides the data and the complement of the data to the output stage 44.

In alternate embodiments, it is contemplated that data input stage 42 may be separate from system 40 and process two or more bits of input data by performing desired boolean operations on that input data, and then provide that data as inputs to the remaining portions of system 40 such as output stage 44.

Output stage 44 may be any circuit which passes its input data to its outputs at some prearranged time such as on the rising edge of a clock signal. It is contemplated that the input to output stage 44 may be a single bit, or may be a single bit and its complement.

Shut-off circuit 46 and reset circuitry 48 together reset the state of system 40 to a predetermined state. Thus, following an output condition being asserted for system 40, shut-off circuitry and reset circuitry 48 act together to reset system 40 to a known state.

Figure 3:
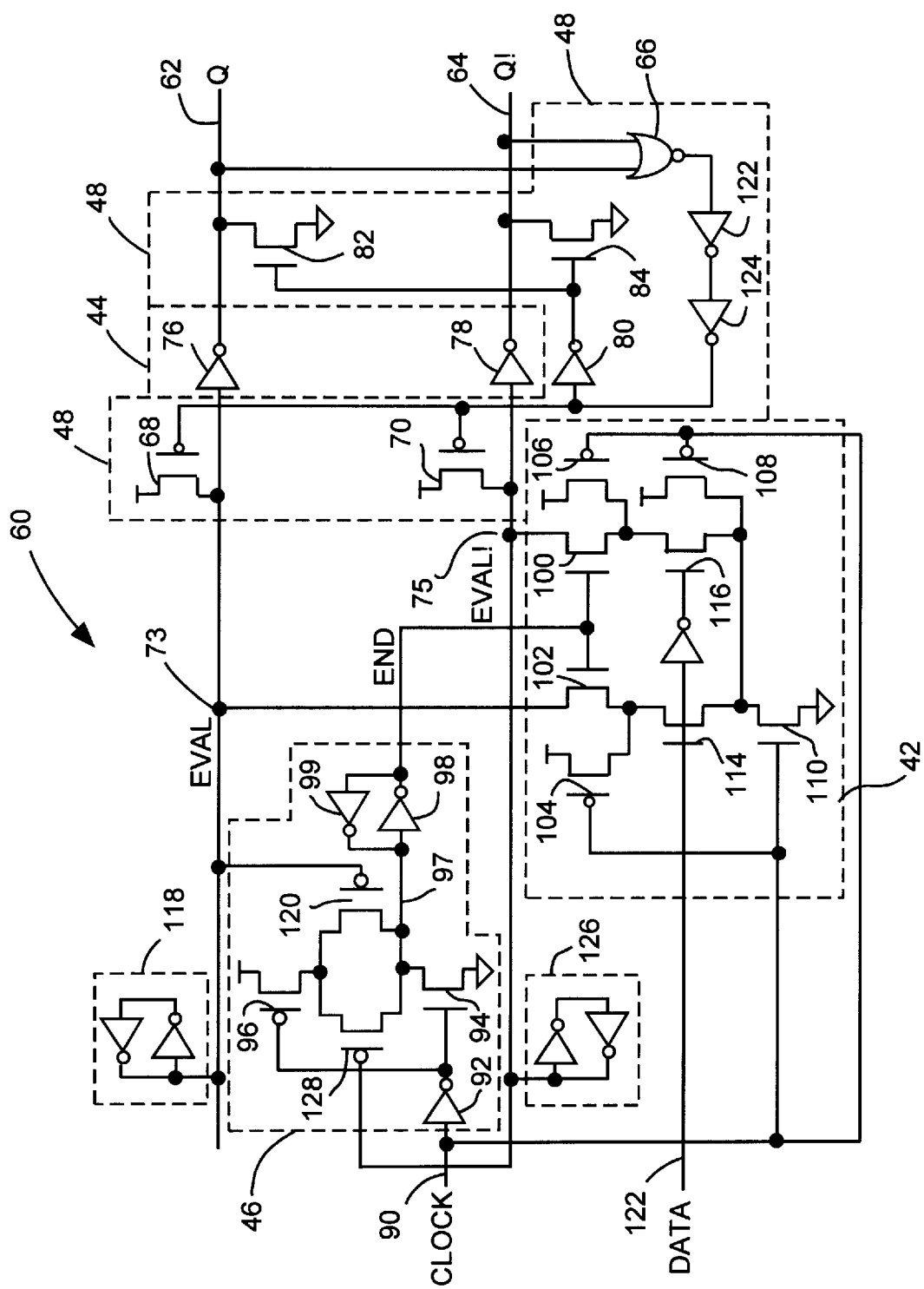
FIG. 3 is a schematic diagram of one embodiment the system of FIG. 2.

FIG. 3 is a schematic diagram of one embodiment the system of FIG. 2.

Referring to FIG. 3, system 60 includes data input stage 42, output stage 44, shut-off circuit 46, and reset circuit 48. The embodiment permits input data to be sampled for a short time interval defined by the clock signal going high and a shut-off circuit output going low.

In FIG. 3 as designed, the desired quiescent state on outputs Q 62 and Q! 64 are low. During power up the clock input 90 is forced low from an outside clock generator. However, on power up, it is possible that either or both of outputs 62 and 64 will be randomly set high. In that instance, reset circuit 48 and output stage 44 operate to ensure that a desired low state is achieved for both output 62 and 64. First, NOR gate 66 will be turned on and therefore have a low output. That low output will be propagated to transistors 68 and 70, turning them on. When transistors 68 and 70 are turned on, output stage from EVAL node 73 and from EVAL! node 75 are forced high, causing inverters 76 and 78 to provide the desired low output state on outputs 62 and 64. At the same time inverters 76 and 78 are switching their outputs to a low state, inverter 80 provides a high to the gates of transistors 82 and 84, causing them to turn on. Turning on transistors 82 and 84 provides a low on outputs 62 and 64, reinforcing the low logic state already established there.

Clock 90 presents signals to the shut-off circuit 46. When clock 90 is low, the output of inverter 92 is high and transistors 94 is turned on and transistor 96 is off. Transistor 94 then provides input 97 with a low logic state. Inverter 98 receives input 97 and generates a high signal which is communicated to data input stage 42. Output from inverter 98 is also presented to inverter 99 such that the combination of inverter 98 and 99 function as a latch. Data input stage 42 has transistors 100 and 102 which are turned on by the high signal presented by inverter 98. Additionally, when clock 90 is low, transistors 104, 106, and 108 are turned on, and transistor 110 is off. With transistors 100, 102, 104, and 106 turned on, output stage inputs 72 and 74 are forced to remain high. Thus, when clock 90 is low, inputs 72 and 74 are both high and outputs 62 and 64 are both low.

As previously noted, data is sampled for a short time interval defined by the clock 90 going high and a shut-off circuit output going low. Data input stage 42 is presented with data line 112. If data line 112 is high, transistor 114 is turned on and transistor 116 is turned off. Correspondingly, if the state of data line 112 is low, transistor 114 is turned off and transistor 116 turned on.

When clock 90 is high, transistor 110 is turned on and transistors 104, 106 and 108 are turned off. Turning on transistor 110 provides a low to transistor 114 and transistor 116. As previously mentioned, one of transistors 114 and 116 are turned on depending on the state of the input data.

For illustrative purposes it will be assumed that the data line 112 is high, and transistor 114 is turned on so that the low from transistor 110 is presented to transistor 102. Note that there are two gate delays from the EVAL node 73 and from the EVAL! node 74 to the gates of transistor 100 and transistor 102. Thus, for a short time interval, transistor 102 is turned on, forcing input 72 low. Forcing input 72 low causes output 62 from inverter 76 to switch high. This condition is reinforced by latch 118 which is an element of data input stage 42. The low from input 72 is also presented to transistor 120 which turns transistor 120 on which engages the shut-off circuit to perform its "shut-off" function.

Additionally, when clock 90 goes high, inverter 92 (of shut-off circuit 46) generates a low state which turns on transistor 96 and turns off transistor 94. When transistor 96 is turned on, and transistor 120 is turned on input 97 is forced high causing inverter 98 to generate a low output state which perform the "shut-off" function of turning off transistors 100 and 102. Turning off transistors 100 and 102 blocks the sampling of data from dataline 112.

Once output 62 goes high, the reset process begins anew, with a three gate delay (NOR gate 66 and inverters 122 and 124) prior to input 68 being switched high as previously described.

Note that if dataline 112 is low, transistor 116 is turned on. Recall that for a short time interval transistors 110, 116 and 100 are turned on, forcing input 74 low and causing output 64 to be high. The condition is reinforced by latch 126 which is an element of data input stage 42. The low from input 74 also turns on transistor 128 which engages the shut-off circuit to perform its "shut-off" function.

The inverters 122 and 124 are provided as delay elements so that reset circuit 48 won't operate to inhibit outputs 62 and 64 until the data has been present on those outputs for a period of time during which a succeeding stage will have recognized the data. The use of more than one pair of inverters would further delay the operation of reset circuit 48, thereby causing signals on outputs 62 and 64 to be valid for a longer period of time, should succeeding stages require that extra time.

Figure 4:
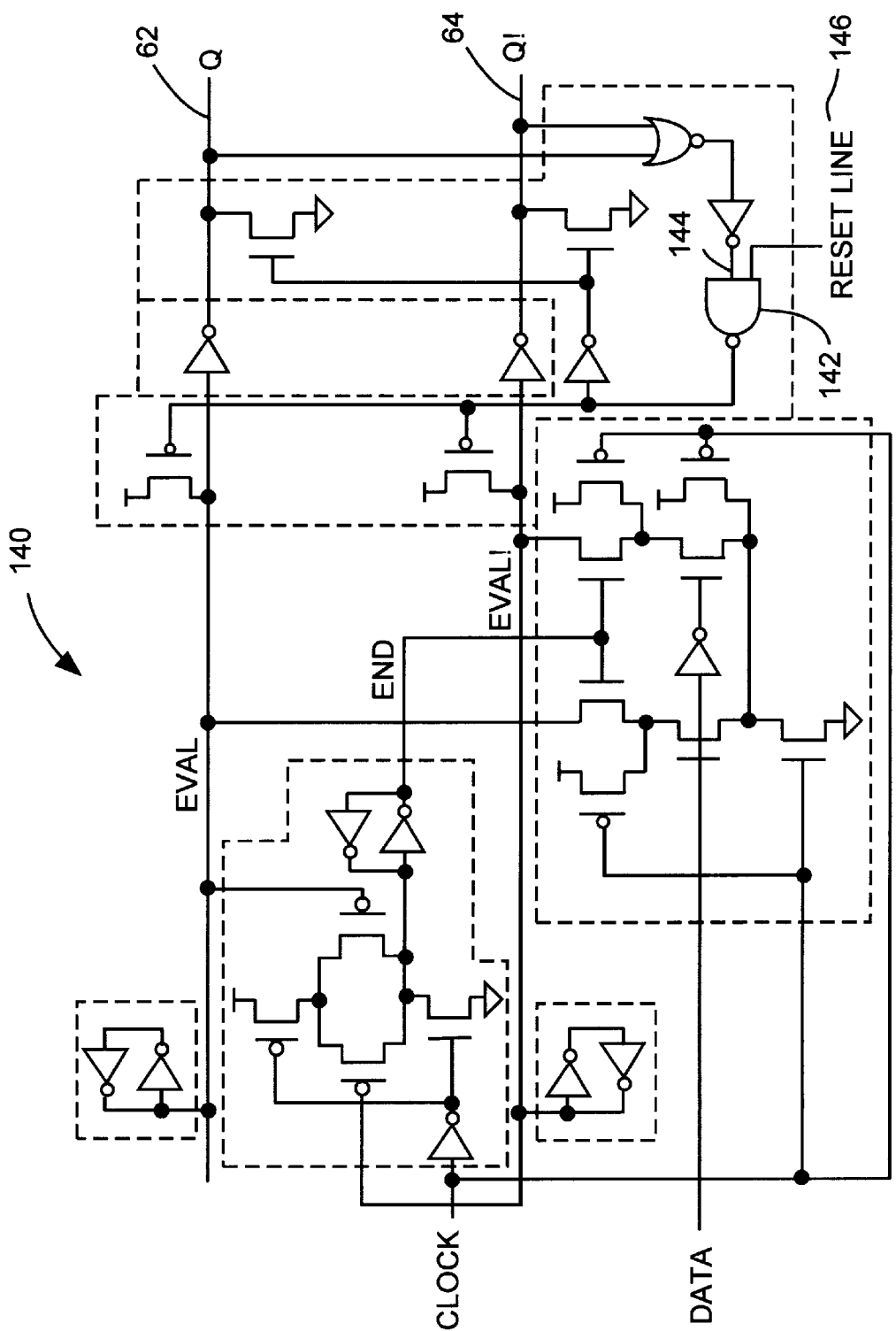
FIG. 4 is a schematic diagram showing an alternate embodiment present invention apparatus.

FIG. 4 is a schematic diagram showing an alternate embodiment present invention apparatus. Referring to FIG. 4, system 140 is identical to system 60 of FIG. 3 except inverter 124 of FIG. 3 has been replaced with NAND gate 142 of FIG. 4.

NAND gate 124 is provided as an example of one way to control the resetting of outputs 62 and 64 and inputs 72 and 74 through external means if necessary. In this embodiment, the resetting of the system takes place when inputs 144 and 146 are both high and generate a low. One use for this type of reset signal is if a succeeding stage had a feedback mechanism which communicates with system 140 informing system 140 that data from a given operation is no longer required. In that instance, the succeeding stage would provide a logical high to reset line 146 when it no longer requires the data.

This particular self reset flip-flop with a self shut-off circuit reduces hold time for the data inputs and provides reduced clock loading. Additionally, the flip-flop circuit provides more robustness and better noise immunity than previous self reset flop designs. Finally, the self reset flip-flop with shut-off circuit is a simple design which occupies a small area.

While embodiments and applications for this present invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A flip-flop circuit system comprising:
   a data input stage having a clock input, a data input and an input stage output;
   an output stage, having an input coupled to said input stage output, which generates at least one data output;
   a reset circuit, having a reset input coupled to said data output and having a reset output coupled to said output stage, which resets the logic state of said output stage to a predetermined desired condition; and
   a shutoff circuit which receives said clock input and said input stage output and generates a shut-off circuit output signal which is presented to said data input stage to disable said data input stage after a predetermined time period.

2. The flip-flop circuit system of claim 1 wherein said shutoff circuit operates to disable the input signal prior to said reset circuit resetting the logic state of said data output.

3. The flip-flop circuit system of claim 1 wherein a time delay between said shutoff circuit operating and said reset circuit operating is set by difference of the number of logic gates required to switch states in the shutoff circuit and the number of logic gates required to switch states in the reset circuit.

4. The flip-flop circuit system of claim 1 wherein said output stage has a first data output and a second data output, said second data output being the complement of said first data output.

5. The flip-flop circuit system of claim 1 further comprising a data processing circuit having a feedback mechanism coupled to said reset circuit which informs said reset circuit that data is no longer required.

6. A method for operating a flip-flop circuit including a data input stage having a data input, a clock input, and input stage output coupled to an output stage having an input coupled to said input stage output and generating at least one data output, a reset circuit coupled to said output stage for resetting the logic state of the data outputs to a predetermined desired condition and a shutoff circuit coupled to said data input stage and said clock input for blocking said data input from being acted on by said data input stage after a predetermined time period, the method comprising:

causing said data input stage to receive data from a data source;

causing said output stage to receive data from said data input stage to generate said data output;

causing said shutoff circuit to disable the data input of said data input stage so that signals present on said data input do not affect the logic state of the output stage; and causing said reset circuitry to reset the output of said output stage to a predetermined condition.

7. A method for operating a flip-flop circuit in a data processing circuit, said flip-flop circuit including a data input stage having a data input, a clock input, and input stage output coupled to an output stage having an input coupled to said input stage output and generating at least one data output, a reset circuit coupled to said output stage for resetting the logic state of the data outputs to a predetermined desired condition and a shutoff circuit coupled to said data input stage having said clock input for blocking said data input from being acted on by said data input stage after a predetermined time period, the data processing circuit including a feedback mechanism coupled to said reset circuit, the method comprising:

causing said data input stage to receive data from a data source;

causing said output stage to receive data from said data input stage to generate said data output;

causing said shutoff circuit to disable the data input of said data input stage so that signals present on said data input do not affect the logic state of the output stage;

causing said reset circuitry to reset the output of said output stage to a predetermined condition; and causing said feedback mechanism to inform said reset circuit that said data output is no longer required.

* * * * *